US012014925B2

(12) United States Patent
Venkatasubramanian et al.

(10) Patent No.: US 12,014,925 B2
(45) Date of Patent: Jun. 18, 2024

(54) METAL-DOPED CARBON HARDMASKS

(71) Applicant: Applied Materials, Inc., Santa Clara, CA (US)

(72) Inventors: Eswaranand Venkatasubramanian, Chennai (IN); Bhaskar Jyoti Bhuyan, San Jose, CA (US); Mark J. Saly, Santa Clara, CA (US); Abhijit Basu Mallick, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 451 days.

(21) Appl. No.: 17/330,035

(22) Filed: May 25, 2021

(65) Prior Publication Data

US 2022/0384188 A1 Dec. 1, 2022

(51) Int. Cl.
| | |
|---|---|
| *H01L 21/033* | (2006.01) |
| *C23C 16/30* | (2006.01) |
| *C23C 16/32* | (2006.01) |
| *C23C 16/50* | (2006.01) |
| *H01J 37/32* | (2006.01) |
| *H01L 21/02* | (2006.01) |
| *H01L 21/311* | (2006.01) |

(52) U.S. Cl.
CPC .......... *H01L 21/0332* (2013.01); *C23C 16/30* (2013.01); *C23C 16/32* (2013.01); *C23C 16/50* (2013.01); *H01J 37/32449* (2013.01); *H01J 37/32816* (2013.01); *H01L 21/02115* (2013.01); *H01L 21/02274* (2013.01); *H01J 2237/332* (2013.01); *H01L 21/02205* (2013.01); *H01L 21/31122* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 2012/0129351 A1* | 5/2012 | Konecni | H01L 21/02274 438/758 |
| 2014/0213033 A1* | 7/2014 | Brunco | H01L 21/0337 438/400 |
| 2016/0027614 A1 | 1/2016 | Manna et al. | |
| 2017/0342558 A1 | 11/2017 | Yang et al. | |
| 2020/0051833 A1 | 2/2020 | Chen et al. | |
| 2020/0194272 A1 | 6/2020 | Jain et al. | |

FOREIGN PATENT DOCUMENTS

JP 2018-098287 A 6/2018

OTHER PUBLICATIONS

International Search Report and Written Opinion dated Sep. 13, 2022 in International Patent Application No. PCT/US2022/030715, 9 pages.

* cited by examiner

*Primary Examiner* — Michael G Miller
(74) *Attorney, Agent, or Firm* — Kilpatrick Townsend & Stockton LLP

(57) ABSTRACT

Exemplary deposition methods may include delivering a ruthenium-containing precursor and a hydrogen-containing precursor to a processing region of a semiconductor processing chamber. At least one of the ruthenium-containing precursor or the hydrogen-containing precursor may include carbon. The methods may include forming a plasma of all precursors within the processing region of a semiconductor processing chamber. The methods may include depositing a ruthenium-and-carbon material on a substrate disposed within the processing region of the semiconductor processing chamber.

20 Claims, 2 Drawing Sheets

METAL-DOPED CARBON HARDMASKS

TECHNICAL FIELD

The present technology relates to semiconductor deposition processes. More specifically, the present technology relates to methods of depositing materials incorporating transition metals.

BACKGROUND

Integrated circuits are made possible by processes which produce intricately patterned material layers on substrate surfaces. Producing patterned material on a substrate requires controlled methods of formation and removal of exposed material. Stacked memory, such as vertical or 3D NAND, may include the formation of a series of alternating layers of dielectric materials through which a number of memory holes or apertures may be etched. Mask materials utilized during memory hole formation may be maintained during an etch through dozens or hundreds of layers of material. Hard mask material thicknesses, surface roughness, as well as material selectivity, may lead to inconsistent patterning, which may further affect the uniformity or consistency of the formed structures.

Thus, there is a need for improved systems and methods that can be used to produce high quality devices and structures. These and other needs are addressed by the present technology.

SUMMARY

Exemplary deposition methods may include delivering a ruthenium-containing precursor and a hydrogen-containing precursor to a processing region of a semiconductor processing chamber. At least one of the ruthenium-containing precursor or the hydrogen-containing precursor may include carbon. The methods may include forming a plasma of all precursors within the processing region of a semiconductor processing chamber. The methods may include depositing a ruthenium-and-carbon material on a substrate disposed within the processing region of the semiconductor processing chamber.

In some embodiments, the ruthenium-and-carbon material may be characterized by an as-deposited surface roughness of less than or about 2 nm. The ruthenium-and-carbon material may be characterized by a concentration of ruthenium greater than or about 5 at. %. The ruthenium-and-carbon material may be characterized by a grain size of less than or about 50 Å. A temperature of the substrate may be maintained above or about 300° C. during the depositing the ruthenium-and-carbon material on the substrate. A pressure may be maintained below or about 15 Torr during the depositing the ruthenium-and-carbon material on the substrate. A low-frequency plasma power may be maintained at greater than or about 100 W while depositing the ruthenium-and-carbon material on the substrate. The methods may include ramping one or more of a chamber pressure or a plasma power while depositing the ruthenium-and-carbon material on the substrate. The methods may include providing an argon precursor with the ruthenium-containing precursor and the hydrogen-containing precursor. The methods may include providing a boron-containing precursor or a nitrogen-containing precursor with the ruthenium-containing precursor and the hydrogen-containing precursor. The methods may include removing the ruthenium-and-carbon material utilizing ozone. Removing the ruthenium-and-carbon material may be performed at a substrate temperature below or about 300° C.

Some embodiments of the present technology may encompass deposition methods. The methods may include delivering a transition-metal-containing precursor and a hydrogen-containing precursor to a processing region of a semiconductor processing chamber. At least one of the transition-metal-containing precursor or the hydrogen-containing precursor may include carbon. The methods may include forming a plasma of all precursors within the processing region of a semiconductor processing chamber. The methods may include depositing a transition-metal-and-carbon material on a substrate disposed within the processing region of the semiconductor processing chamber.

In some embodiments, the transition metal may be or include ruthenium or osmium. The transition-metal-and-carbon material may be characterized by a ruthenium or osmium concentration of greater than or about 5 at. %. The methods may include ashing the transition-metal-and-carbon material from the substrate. The ashing may be performed with ozone or plasma-enhanced oxygen. Ashing the transition-metal-and-carbon material may be performed at a substrate temperature below or about 300° C. The methods may include ramping one or more of a chamber pressure or a plasma power while depositing the transition-metal-and-carbon material on the substrate. A low-frequency plasma power may be maintained at greater than or about 100 W while depositing the transition-metal-and-carbon material on the substrate. The transition-metal-containing precursor may be or include an organometallic precursor, or a metal-halide precursor.

Some embodiments of the present technology may encompass deposition methods. The methods may include delivering a transition-metal-containing precursor and a hydrogen-containing precursor to a processing region of a semiconductor processing chamber. At least one of the transition-metal-containing precursor or the hydrogen-containing precursor may include carbon. The methods may include forming a plasma of all precursors within the processing region of a semiconductor processing chamber. The methods may include depositing a transition-metal-and-carbon material on a substrate disposed within the processing region of the semiconductor processing chamber. The transition-metal-and-carbon material may be characterized by a transition metal concentration of greater than or about 5 at. %. The methods may include ashing the transition-metal-and-carbon material from the substrate. The ashing may be performed with ozone or plasma-enhanced oxygen.

Such technology may provide numerous benefits over conventional systems and techniques. For example, the processes may produce metal-containing films characterized by reduced surface roughness. Additionally, the operations of embodiments of the present technology may produce improved mask materials that may facilitate processing operations. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
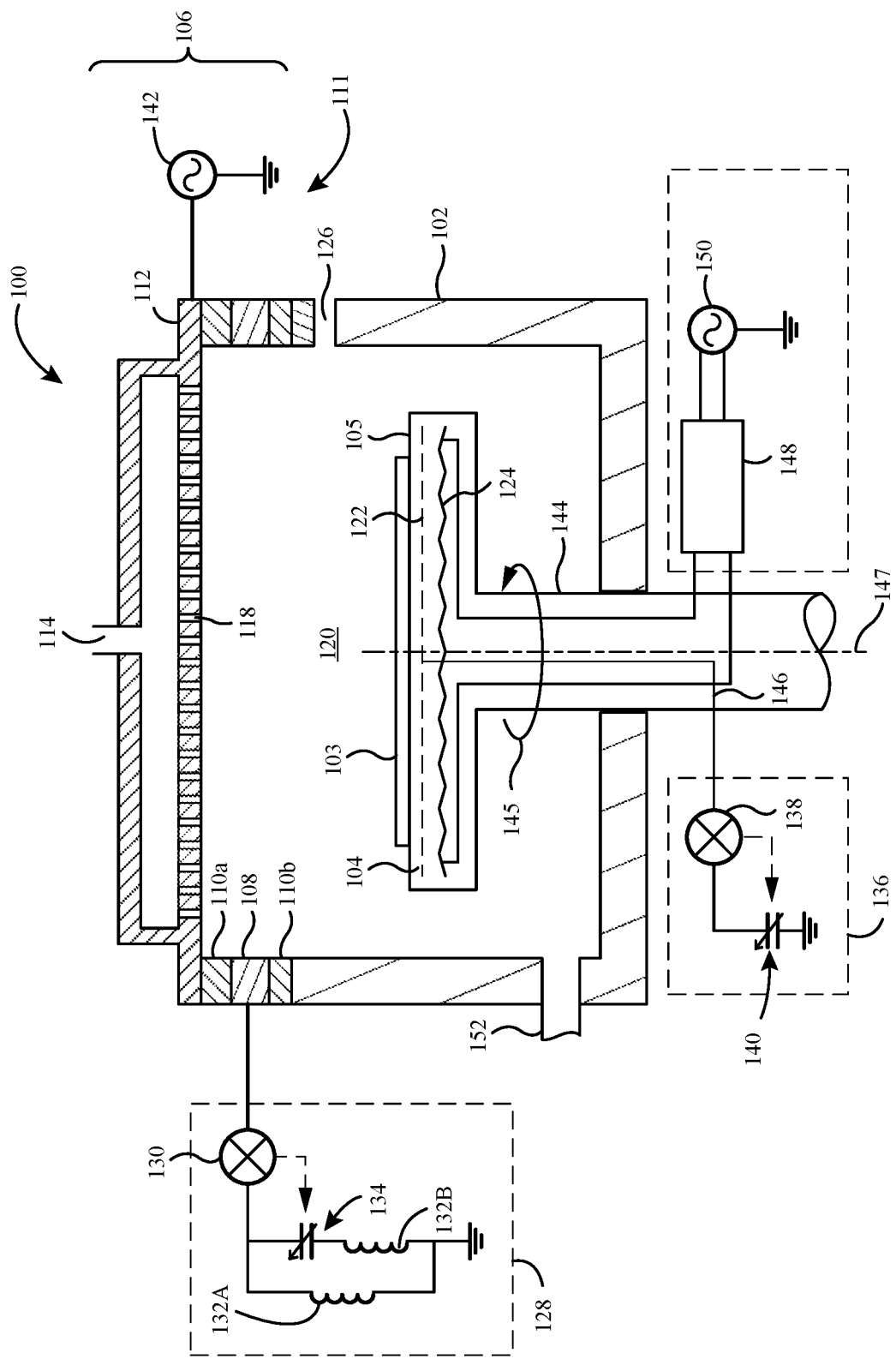
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In transitioning from 2D NAND to 3D NAND, many process operations are modified from vertical to horizontal operations. Additionally, as 3D NAND structures grow in the number of cells being formed, the aspect ratios of memory holes and other structures increase, sometimes dramatically. During 3D NAND processing, stacks of placeholder layers and dielectric materials may form the inter-electrode dielectric layers. These placeholder layers may have a variety of operations performed to place structures before fully removing the material and replacing it with metal. Some processes in particular, such as memory hole formation or staircase formation, may include etching through the majority or all layers of the stack. Mask materials may be used to allow materials to be partially etched, or etched to produce features across the substrate. Utilizing a mask to etch through dozens or hundreds of layers may be challenging for current mask technology.

Many conventional technologies utilize etching processes to produce memory and logic structures that may be incapable of adequately performing at future process nodes. For example, as the number of cells within a structure increases to hundreds of cells, memory holes may be formed to a depth of several microns. Masks used to define the memory holes, for example, may struggle to maintain selectivity for deeper etches. For example, as the number of layer pairs increases, the thickness of conventional masks may be increased, such as to several microns or more. However, increased mask thickness may strain etch processes that need to perform opening operations through the mask, and maintain the features as the underlying structure is etched. Accordingly, conventional mask technologies may be incapable of effective operation at future process nodes.

Transitioning to different mask materials may present new sets of challenges. For example, metal-containing mask layers may increase film hardness or other mechanical properties and etch selectivity, but may cause processing issues. For example, hardmask opening processes may become more difficult to selectively etch. Additionally, the metal incorporation may limit removal operations. For example, carbon hardmasks may be readily removed in oxygen plasma, which allows for a relatively easy stripping operation after the processing through the mask has been completed. Metals are typically not volatile when contacted by oxygen plasma, which may require more aggressive removal. For example, wet etching or chemical-mechanical polishing may be employed to remove the metal hardmask. Accordingly, overall processing may be further challenged with these mask materials, and throughput may be detrimentally impacted by newer materials. Additionally, metal-containing hardmasks may not provide sufficient film properties for processing discrete features on a substrate. For example, carbon hardmasks may be substantially amorphous, and small features, such as memory holes in 3D NAND may be formed through the mask with high uniformity. Metal-containing mask materials may have increased roughness due to the grain formation, which may cause shifting and roughness in the mask opening, and which may translate to the substrate during the etch process, causing yield issues or loss.

The present technology may overcome these limitations by producing metal-containing hardmasks, which may be characterized by lower film roughness and grain sizing. Advantageously, hardmasks according to some embodiments of the present technology may also be readily stripped in ashing processes with an oxygen-containing removal process. For example, the hardmasks may be removed with ozone or oxygen-containing plasma after processing has been completed. This may facilitate improved selectivity over carbon or silicon hardmasks, while having limited impact on throughput. After describing general aspects of a chamber according to embodiments of the present technology in which plasma processing operations discussed below may be performed, specific methodology and component configurations may be discussed. It is to be understood that the present technology is not intended to be limited to the specific films and processing discussed, as the techniques described may be used to improve a number of film formation processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
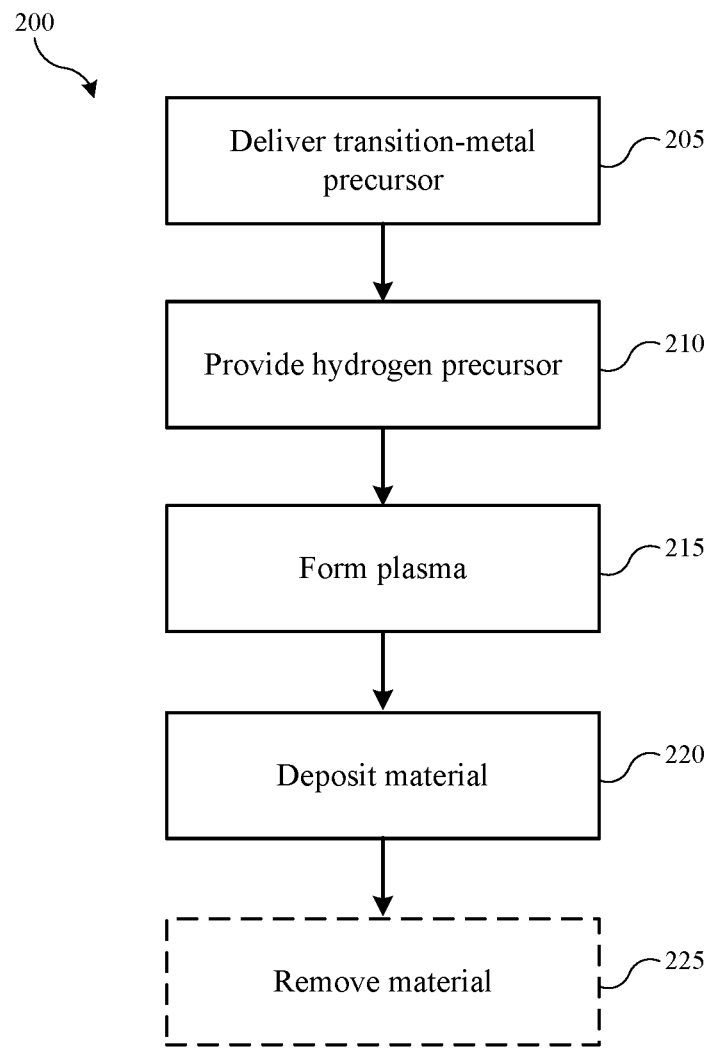
FIG. 2 shows exemplary operations in a deposition method according to some embodiments of the present technology.

FIG. 2 shows exemplary operations in a deposition method 200 according to some embodiments of the present technology. The method may be performed in a variety of processing chambers, including processing chamber 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 200 may include additional operations prior to initiation of the listed operations. For example, additional processing operations may include forming structures on a semiconductor substrate, including stacks of material for 3D NAND, forming transistor or other memory structures, or any other processing that may include both forming and removing material. Prior processing operations may be performed in the chamber in which method 200 may be performed, or processing may be performed in one or more other processing chambers prior to delivering the substrate into the semiconductor processing chamber in which method 200 may be performed. Regardless, method 200 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing volume 120 described above.

The substrate may be or include any number of materials on which materials may be deposited. The substrate may be or include silicon, germanium, dielectric materials including silicon oxide or silicon nitride, metal materials, or any number of combinations of these materials, which may be the substrate, or materials formed on the substrate. In some embodiments optional treatment operations, such as a pretreatment, may be performed to prepare a surface of the substrate for deposition. For example, a pretreatment may be performed to provide certain ligand terminations on the surface of the substrate, and which may facilitate nucleation of a film to be deposited. For example, hydrogen, oxygen, carbon, nitrogen, or other molecular terminations, including any combination of these atoms or radicals may be adsorbed, reacted, or formed on a surface of a substrate. Additionally, material removal may be performed, such as reduction of native oxides or etching of material, or any other operation that may prepare one or more exposed surfaces of the substrate for deposition.

At operation 205, one or more precursors may be delivered to the processing region of the chamber. For example, in exemplary embodiments in which a transition-metal-incorporated carbon film may be formed, a transition-metal-containing precursor may be delivered to the processing region of the processing chamber. Plasma enhanced deposition may be performed in some embodiments of the present technology, which may facilitate material reactions and deposition. As noted above, some embodiments of the present technology may encompass formation or deposition of transition-metal-and-carbon materials, which may be characterized conventionally by increased surface roughness, such as in comparison to thermally or plasma produced silicon and carbon films, for example. By controlling formation characteristics and precursors utilized in the processing, the present technology may produce metal-containing films characterized by reduced surface roughness and grain size, while also producing materials that may be more easily removed subsequent processing.

Some embodiments of the present technology may include additionally providing a hydrogen-containing precursor at operation 210, and which may be provided with the transition-metal-containing precursor. In some embodiments, a carbon-containing precursor may also be provided, which may produce a transition metal and carbon film. The carbon-containing precursor may be the transition-metal precursor, the hydrogen-containing precursor, or a separate precursor utilized in embodiments of the present technology. The precursors delivered may all be used to form a plasma within the processing region of the semiconductor processing chamber at operation 215. At operation 220, a transition-metal-and-carbon material may be deposited on the substrate. One or more additional precursors may also be included, such as argon, helium, nitrogen, or other carrier or inert gases, which may facilitate plasma formation and development of film characteristics. By producing plasma effluents of the precursors according to some embodiments of the present technology, material roughness and grain formation may be controlled and limited.

For example, incorporating metal materials in the film may cause more expansive grain formation instead of producing a more amorphous film. By incorporating an additional hydrogen and or inert source, such as argon or helium, along with controlling environment and plasma parameters, a film modification, or profile etch, may be performed simultaneously with the deposition of material. For example, through reaction and/or physical interaction with features being formed of the transition-metal-and-carbon material, hydrogen or inert gas ions and/or neutral species may trim the grain and surface formation while a more uniform profile of formation is being produced. Consequently, the grains may not extend to as great a degree relative to conventional processes attempting to incorporate metals. To provide sufficient radicals in the process, the hydrogen-containing precursor and/or inert gas or carrier gas may be included at a greater flow rate than the transition-metal-containing precursor.

For example, thermally produced silicon or carbon may be characterized by relatively low average roughness, such as less than or about 0.5 nm. The film may also be characterized by a relatively low roughness range, such as the difference between a highest peak and a lowest peak on the formed film. For example, the roughness range may be less than or about 1.5 nm, or less than or about 1 nm. However, for metal-containing films produced according to conventional technology, an average roughness may be greater than or about 3 nm, greater than or about 4 nm, greater than or about 5 nm, or more, for a similar thickness film, although as noted roughness may increase with increased film thickness. Moreover, the range of roughness of the produced metal-containing material may be greater than or about 10 nm, and may be greater than or about 15 nm, or more, again depending on the film thickness. Additionally, grain size within the film may be greater than or about 3 nm, greater than or about 4 nm, greater than or about 5 nm, or more. During subsequent etching operations, these larger disparities across the film may challenge etching operation uniformity, and may require additional operations to be performed, such as an additional chemical-mechanical polishing operation.

The present technology, however, may reduce or greatly reduce both the average roughness and the range of roughness of produced transition-metal-and-carbon films by performing a substantially simultaneous etch utilizing an additional hydrogen-containing precursor and/or an argon or other inert gas, and/or by performing one or more additional adjustments described further below. For example, by depositing transition-metal-containing materials according to some embodiments of the present technology, the as-deposited materials may be characterized by an average roughness of less than or about 5 nm, and may be characterized by an average roughness of less than or about 4 nm, less than or about 3.5 nm, less than or about 3.0 nm, less than or about 2.5 nm, less than or about 2.0 nm, less than or about 1.5 nm, less than or about 1.0 nm, less than or about 0.9 nm, less than or about 0.8 nm, less than or about 0.7 nm, less than or about 0.6 nm, less than or about 0.5 nm, or less.

Additionally, the roughness may be substantially controlled regardless of film thickness in some embodiments. This may allow avoidance of additional chemical-mechanical polishing operations, as the as-deposited film may be characterized by any of the average roughness ranges illustrated. Additionally, the roughness range across the as-deposited film may be less than or about 10 nm, and may be less than or about 9 nm, less than or about 8 nm, less than or about 7 nm, less than or about 6 nm, less than or about 5 nm, less than or about 4 nm, less than or about 3 nm, less than or about 2 nm, less than or about 1 nm, or less. Similarly, the controlled etch process during growth may also facilitate reduction in grain size of the metal-containing material, and grain size may be maintained at less than or about 5 nm, less than or about 4 nm, less than or about 3 nm, less than or about 2 nm, less than or about 1 nm, less than or about 9 Å, less than or about 8 Å, less than or about 7 Å, less than or about 6 Å, or less. Consequently, improved materials may be produced, which may afford film and mask benefits over conventional materials and processes, as well as potentially reducing fabrication operations by limiting or reducing the number of polishing operations in a sequence.

Any number of precursors may be used with the present technology with regard to the transition-metal-containing precursor, the hydrogen-containing precursor, and the carbon-containing precursor, when included. Any number of transition metals may be encompassed by the present technology, including cobalt, chromium, hafnium, molybdenum, osmium, rhenium, ruthenium, tantalum, titanium, tungsten, zirconium, or any other metal or transition metal that may be provided as a deposition precursor. For example, the transition-metal precursors may be or include transition-metal halides, as well as organometallic precursors. When organometallic precursors are used, a carbon-containing precursor may not be used, for example. As one non-limiting example, the transition metal may be or include ruthenium or osmium. Exemplary precursors may be or include bis(cyclopentadienyl)ruthenium, bis(ethylcyclopentadienyl)ruthenium, triruthenium dodecacarbonyl, triosmium dodecacarbonyl, or any other ruthenium or osmium precursor, including halogen-containing precursors, as well as any other transition-metal precursor.

Hydrogen-containing precursors may include diatomic hydrogen, as well as hydrogen-containing materials, such as may be or include carbon-containing precursors. When they are included, carbon-containing precursors may be or include any hydrocarbon, or any material including or consisting of carbon and hydrogen. In some embodiments, the carbon-containing precursor may be characterized by one or more carbon-carbon double bonds and/or one or more carbon-carbon triple bonds. Accordingly, in some embodiments the carbon-containing precursor may be or include an alkene or an alkyne, such as acetylene, ethylene, propene, or any other carbon-containing material. The precursor may include carbon-and-hydrogen-containing precursors, which may include any amount of carbon and hydrogen bonding, along with any other element bonding, although in some embodiments the carbon-containing precursor may consist of carbon-to-carbon and carbon-to-hydrogen bonding.

The incorporation of the transition metal and or the carbon may be tuned to increase or decrease the incorporation based on one or more deposition parameters discussed further below. In some embodiments, the transition metal may be incorporated at greater than or about 5 at. %, and may be incorporated at greater than or about 10 at. %, greater than or about 15 at. %, greater than or about 20 at. %, greater than or about 25 at. %, greater than or about 30 at. %, greater than or about 35 at. %, greater than or about 40 at. %, greater than or about 45 at. %, greater than or about 50 at. %, greater than or about 55 at. %, greater than or about 60 at. %, greater than or about 65 at. %, greater than or about 70 at. %, or higher, although as the transition-metal incorporation increases, surface roughness may increase, and roughness characteristics may exceed thresholds discussed above due to formation of a more columnar structure. Accordingly, in some embodiments the transition metal may be incorporated at less than or about 75 at. %, and may be maintained at less than or about 70 at. %, less than or about 65 at. %, less than or about 60 at. %, less than or about 55 at. %, less than or about 50 at. %, or less, which may maintain a majority carbon concentration in some embodiments. Carbon and/or hydrogen may represent the remainder percentage in any compositions including transition metal incorporation within the ranges noted above, along with an amount of nitrogen, oxygen, or other residual materials that may be incorporated in trace amounts.

One or more additional aspects of the deposition may also be tuned to improve aspects of the deposition being performed. For example, the plasma power may impact the extent of precursor dissociation, and embodiments may include both high-frequency RF and low-frequency RF applied to the electrodes. An interface layer may be produced in some embodiments to facilitate adhesion of the materials formed. During generation of the plasma, an initial power may be applied by the high-frequency RF source, such as to a faceplate or first electrode, which may be subsequently ramped or stepped to a bulk deposition power. By utilizing a lower generation power, a lower amount of dissociation may occur, which may increase carbon incorporation in the film. At the substrate interface, this may also facilitate production of smaller grain sizes throughout the film deposited. Accordingly, in some embodiments the plasma may initially be generated at a high-frequency plasma power, such as operating at 13.56 MHz or 27 MHz, among other frequencies, at a power of less than or about 500 W, and may be generated at a power of less than or about 400 W, less than or about 300 W, less than or about 200 W, or less.

Subsequent a first period of time, the power may be ramped or stepped to a higher power, which may increase deposition as well as transition metal incorporation. For example, the power may be stepped or ramped to a power greater than or about 500 W, and may be stepped or ramped to a power greater than or about 600 W, greater than or about 700 W, greater than or about 800 W, greater than or about 900 W, greater than or about 1000 W, greater than or about 1100 W, greater than or about 1200 W, greater than or about 1300 W, greater than or about 1400 W, greater than or about 1500 W, or higher.

A low-frequency RF power may also be applied, such as to the substrate, pedestal, or a second electrode, and which may be applied at less than or about 1000 kHz, and may be applied at less than or about 750 kHz, less than or about 500 kHz, less than or about 450 kHz, less than or about 400 kHz, less than or about 350 kHz, less than or about 300 kHz, less than or about 250 kHz, less than or about 200 kHz, or less, including down to zero, where the low-frequency power may not be used. The low-frequency RF supply may increase ion energy, and physical impact on the film being produced, which may facilitate reduction in grain size as discussed above. Additionally, the power may provide lower film stress. For example, while carbon hardmasks may be characterized by a more neutral film, metal-containing materials may be characterized by a more tensile stress, which may cause stress on the underlying structure, especially subsequent mask patterning. By increasing a low-frequency RF power, the stress may be lowered to produce a film characterized by a more neutral stress, similar to a carbon hardmask. Accordingly, in some embodiments the low-frequency power may be applied at greater than or about 100 W, and may be applied at greater than or about 150 W, greater than or about 200 W, greater than or about 250 W, greater than or about 300 W, greater than or about 350 W, greater than or about 400 W, greater than or about 450 W, greater than or about 500 W, or more, although in some embodiments the power may be maintained at less than or about 500 W, which may cause roughness to increase due to increased bombardment.

The temperatures of the substrate may additionally impact the deposition. For example, in some embodiments the substrate may be maintained at a temperature of greater than or about 300° C., and may be maintained at a temperature of greater than or about 320° C., greater than or about 340° C., greater than or about 360° C., greater than or about 380° C., greater than or about 400° C., greater than or about 420° C., greater than or about 440° C., greater than or about 460° C., greater than or about 480° C., greater than or about 500° C., or greater. Additionally, the pressure within the processing region may affect the amount of ionization and physical interaction performed during the deposition. By lowering a processing pressure, lower ionization may occur, which may increase carbon concentration, such as at an interfacial region. By increasing a processing pressure, increased ionization may occur, which may facilitate increasing transition metal incorporation and deposition rate. Hence, similar to plasma power, pressure within the processing region may be adjusted from a first pressure during generation of the plasma to a second, higher pressure after a first period of time. Accordingly, in some embodiments a processing pressure during generation may be maintained at less than or about 6 Torr, and may be maintained at less than or about 5 Torr, less than or about 4 Torr, less than or about 3 Torr, less than or about 2 Torr, or less. Subsequent the first period of time, the pressure may be stepped or ramped to greater than or about 5 Torr, greater than or about 6 Torr, greater than or about 7 Torr, greater than or about 8 Torr, greater than or about 9 Torr, greater than or about 10 Torr, greater than or about 11 Torr, greater than or about 12 Torr, greater than or about 13 Torr, greater than or about 14 Torr, greater than or about 15 Torr, or more, in some embodiments.

As noted previously, process conditions may be initially set to facilitate adhesion and grain control, followed by adjustments for bulk deposition after a first period of time. Because the interface layer may be limited to a few monolayers to promote adhesion, the first period of time may be maintained at less than or about 10 seconds, and may be maintained at less than or about 9 seconds, less than or about 8 seconds, less than or about 7 seconds, less than or about 6 seconds, less than or about 5 seconds, less than or about 4 seconds, less than or about 3 seconds, less than or about 2 seconds, or less, followed by a transition to bulk deposition. As an additional operation that may be performed during the first period of time, a boron-containing precursor and/or a nitrogen-containing precursor may be included with the transition-metal precursor, which may increase adhesion and interfacial properties. Delivery of the boron-containing precursor or the nitrogen-containing precursor, which may include diborane or any other boron-containing precursor as well as diatomic nitrogen or any other nitrogen-containing precursor, may be halted after the first period of time. By performing deposition according to embodiments of the present technology, reduced roughness of transition-metal-and-carbon-containing films may be afforded, which may improve hardmask effectiveness.

Additionally, in some embodiments of the present technology, mask removal subsequent processing may be performed by ashing. For example, after mask deposition, any number of operations may be performed including photolithography and mask opening, as well any number of patterning or etching operations utilizing the mask. After the processing has been completed, the mask may be removed or etched away at optional operation 225. While conventional technologies may be forced to utilize more aggressive etching processes when metals are incorporated in the films, the present technology may utilize transition metals that may ash in an oxygen-containing plasma or with ozone. Although any number of wet etching or dry etching, such as utilizing plasma-enhanced halides, may be used in some embodiments, by utilizing transition metals that may produce volatile oxygen-containing materials, the present technology may allow stripping or ashing similar to carbon hardmasks.

In some embodiments as noted above, the transition metal incorporated may be ruthenium or osmium, which may produce volatile complexes during oxygen-containing stripping operations. For example, operation 225 may include contacting the transition-metal-and-carbon hardmask with ozone or an oxygen-containing plasma. In some embodiments, the removal operation may be limited to utilizing ozone or an oxygen-containing plasma. The ashing may remove the entire film, and may not require subsequent dry or wet etching in some embodiments of the present technology. In some embodiments, the removal may be performed at a removal temperature that may be controlled to limit adverse reactions, for example. In some embodiments the removal may be performed at a temperature of greater than or about 100° C., greater than or about 120° C., greater than or about 140° C., greater than or about 160° C., greater than or about 180° C., greater than or about 200° C., greater than or about 220° C., greater than or about 240° C., greater than or about 260° C., greater than or about 280° C., greater than or about 300° C., or more.

However, as temperature increases, alternative oxide materials may be produced or additional phases of the metal may be produced, which may be characterized by reduced volatility, and may limit or prevent removal by oxygen or other etchants. Accordingly, to ensure the production of volatile oxides, in some embodiments the removal may be performed at a temperature of less than or about 500° C., and may be performed at a temperature of less than or about 450° C., less than or about 400° C., less than or about 380° C., less than or about 360° C., less than or about 340° C., less than or about 320° C., less than or about 300° C., less than or about 280° C., or less. Accordingly, by depositing and/or removing mask materials according to embodiments of the present technology, hardmasks including transition metals may be formed, which may be characterized by reduced roughness and stress, while being characterized by improved removal and deposition compared to conventional technologies.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A deposition method comprising:
   delivering a ruthenium-containing precursor and a hydrogen-containing precursor to a processing region of a semiconductor processing chamber, wherein at least one of the ruthenium-containing precursor or the hydrogen-containing precursor comprises carbon;
   forming a plasma of all precursors within the processing region of a semiconductor processing chamber; and
   depositing a ruthenium-and-carbon material on a substrate disposed within the processing region of the semiconductor processing chamber, wherein the ruthenium-and-carbon material is characterized by an as-deposited surface roughness of less than or about 1.0 nm.

2. The deposition method of claim 1, wherein the ruthenium-and-carbon material is characterized by an as-deposited surface roughness of less than or about 0.5 nm.

3. The deposition method of claim 1, wherein the ruthenium-and-carbon material is characterized by a concentration of ruthenium greater than or about 5 at. %.

4. The deposition method of claim 1, wherein the ruthenium-and-carbon material is characterized by a grain size of less than or about 50 Å.

5. The deposition method of claim 1, wherein a temperature of the substrate is maintained above or about 300° C. during the depositing the ruthenium-and-carbon material on the substrate.

6. The deposition method of claim 1, wherein a pressure is maintained below or about 15 Torr during the depositing the ruthenium-and-carbon material on the substrate.

7. The deposition method of claim 1, wherein a low-frequency plasma power is maintained at greater than or about 100 W while depositing the ruthenium-and-carbon material on the substrate.

8. The deposition method of claim 1, further comprising ramping one or more of a chamber pressure or a plasma power while depositing the ruthenium-and-carbon material on the substrate.

9. The deposition method of claim 1, further comprising:
   providing an argon precursor with the ruthenium-containing precursor and the hydrogen-containing precursor.

10. The deposition method of claim 1, further comprising providing a boron-containing precursor or a nitrogen-containing precursor with the ruthenium-containing precursor and the hydrogen-containing precursor.

11. The deposition method of claim 1, further comprising removing the ruthenium-and-carbon material utilizing ozone.

12. The deposition method of claim 11, wherein removing the ruthenium-and-carbon material is performed at a substrate temperature below or about 300° C.

13. A deposition method comprising:
   delivering a transition-metal-containing precursor and a hydrogen-containing precursor to a processing region of a semiconductor processing chamber, wherein at least one of the transition-metal-containing precursor or the hydrogen-containing precursor comprises carbon;
   forming a plasma of all precursors within the processing region of a semiconductor processing chamber; and
   depositing a transition-metal-and-carbon material on a substrate disposed within the processing region of the semiconductor processing chamber, wherein a temperature of the substrate is maintained above or about 450° C. during the depositing the transition-metal-and-carbon material on the substrate, and wherein the transition-metal-and-carbon material is characterized by an as-deposited surface roughness of less than or about 1.5 nm.

14. The deposition method of claim 13, wherein the transition metal comprises ruthenium or osmium, and wherein the transition-metal-and-carbon material is characterized by a ruthenium or osmium concentration of greater than 55 at. %.

15. The deposition method of claim 13, further comprising:
ashing the transition-metal-and-carbon material from the substrate, wherein the ashing is performed with ozone or plasma-enhanced oxygen.

16. The deposition method of claim 15, wherein ashing the transition-metal-and-carbon material is performed at a substrate temperature below or about 300° C.

17. The deposition method of claim 13, further comprising:
ramping one or more of a chamber pressure or a plasma power while depositing the transition-metal-and-carbon material on the substrate.

18. The deposition method of claim 13, wherein a low-frequency plasma power is maintained at greater than or about 100 W while depositing the transition-metal-and-carbon material on the substrate.

19. The deposition method of claim 13, wherein the transition-metal-containing precursor comprises an organometallic precursor, or a metal-halide precursor.

20. A deposition method comprising:
delivering a transition-metal-containing precursor and a hydrogen-containing precursor to a processing region of a semiconductor processing chamber, wherein at least one of the transition-metal-containing precursor or the hydrogen-containing precursor comprises carbon;
forming a plasma of all precursors within the processing region of a semiconductor processing chamber;
depositing a transition-metal-and-carbon material on a substrate disposed within the processing region of the semiconductor processing chamber, wherein a temperature of the substrate is maintained above or about 450° C. during the depositing the transition-metal-and-carbon material on the substrate, wherein the transition-metal-and-carbon material is characterized by an as-deposited surface roughness of less than or about 1.5 nm, and wherein the transition-metal-and-carbon material is characterized by a transition metal concentration of greater than or about 55 at. %; and
ashing the transition-metal-and-carbon material from the substrate, wherein the ashing is performed with ozone or plasma-enhanced oxygen.

\* \* \* \* \*